(12) United States Patent
Van Doren et al.

(10) Patent No.: US 7,869,003 B2
(45) Date of Patent: Jan. 11, 2011

(54) LITHOGRAPHIC APPARATUS AND DEVICE MANUFACTURING METHOD WITH RETICLE GRIPPER

(75) Inventors: Matthew J. Van Doren, Southbury, CT (US); Jonathan H. Feroce, Shelton, CT (US)

(73) Assignee: ASML Holding NV, Veldhoven (NL)

( * ) Notice: Subject to any disclaimer, the term of this patent is extended or adjusted under 35 U.S.C. 154(b) by 569 days.

(21) Appl. No.: 11/484,855

(22) Filed: Jul. 12, 2006

(65) Prior Publication Data

US 2008/0014508 A1 Jan. 17, 2008

(51) Int. Cl.
*G03B 27/62* (2006.01)
(52) U.S. Cl. ........................................... 355/75
(58) Field of Classification Search .................. 355/75, 355/72–74, 76, 53; 430/5
See application file for complete search history.

(56) References Cited

U.S. PATENT DOCUMENTS 3,319,951 A 5/1967 Seelig
4,776,684 A 10/1988 Schmidt-Kaler ............ 350/613
6,172,738 B1* 1/2001 Korenaga et al. ............. 355/53
2003/0162101 A1* 8/2003 Heerens et al. .................. 430/5

FOREIGN PATENT DOCUMENTS

| JP | 09-008103 | | 1/1997 |
| JP | 2001-085494 | A | 3/2001 |
| JP | 2002-203782 | A | 7/2002 |
| JP | 2004-535681 | A | 11/2004 |
| JP | 2005-045253 | A | 2/2005 |
| JP | 2005-235890 | A | 9/2005 |
| WO | 2003-017344 | A1 | 2/2003 |

OTHER PUBLICATIONS

Office Action in related Japanese Application 2007-176951 mailed Sep. 16, 2010.

* cited by examiner

*Primary Examiner*—Edward J Glick
*Assistant Examiner*—Chia-how Michael Liu
(74) *Attorney, Agent, or Firm*—Pillsbury Winthrop Shaw Pittman LLP

(57) ABSTRACT

A reticle gripper to hold a reticle of a lithographic apparatus is presented. The reticle gripper includes three gripper structures to contact the surface of the reticle. Each of the three gripper structures determines a position with respect to the reticle gripper of one of the points on the surface of the reticle.

21 Claims, 6 Drawing Sheets

LITHOGRAPHIC APPARATUS AND DEVICE MANUFACTURING METHOD WITH RETICLE GRIPPER

BACKGROUND

1. Field of the Invention

The present invention relates to a reticle gripper to hold a reticle of a lithographic apparatus, a lithographic apparatus including such reticle gripper, a reticle handler robot including such reticle gripper, a device manufacturing method, and a method to bring a reticle to a reticle support.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In a lithographic apparatus, it is common that a reticle (also referred to in this document as patterning device or mask, the term reticle may in this document be understood to be a synonym for pattering device and/or mask), is exchanged from time to time. This may be to use the lithographic apparatus to apply a different pattern onto a substrate, e.g. a different layer of a semiconductor device, or to apply different patterns onto e.g. different parts of a surface of a substrate. The reticle may also be exchanged for other reasons. When exchanging the reticle, the reticle may be displaced by a gripper, which is constructed to hold the reticle. The gripper may form part of a reticle handler robot, and may e.g. be included in or connected to an arm of such robot. Requirements on the reticle gripper are high. This is because it is desirable that the reticle be handled carefully to avoid damage or contamination. In particular, the transfer of the reticle to a reticle stage, the reticle stage to hold the reticle, is important because any deformation of the reticle might impair the performance of the lithographic apparatus.

In order to avoid a deformation of the reticle, existing gripper designs have made use of elastic averaging to hold the reticle to the gripper. Elastic averaging relies on a (forced) geometric congruence between the gripper and the reticle. Further, for the reticle gripper, vacuum pressure is used to force the reticle into contact with the gripper. The gripper is in such existing designs provided with nominally flat interface surfaces, to avoid as much as possible a deformation of the reticle. Such gripper design to hold the reticle can however create problems as the forced geometric congruence may lead to undesired deformations of e.g. the reticle. Manufacturing limitations result in relatively large non-flatness errors in the contacting surfaces (thus e.g. the interface surfaces of the gripper and/or the surface of the reticle). As a result thereof, the reticle may be warped or bowed when held by the gripper. In part, such deformations of the reticle may recover because of an elasticity of the reticle, however some or all of these unwanted deformations of the reticle may continue to exist when the reticle is in use in the lithographic apparatus.

Furthermore, in present a lithographic apparatus, the transfer from the gripper to the reticle stage takes place such that for a brief period the reticle is held by vacuum pressure to both the gripper and to the reticle stage. If the reticle is deformed by the gripper, some of the deformation may have no opportunity to recover because of the mechanics of the transfer with simultaneous holding by gripper and reticle stage. In other words, the transfer may "lock in" the deformed shape of the reticle.

In general, deformations of the reticle may result in overlay errors in the photolithographic process performed by the lithographic apparatus.

SUMMARY

It is desirable to provide an improved handling of the reticle to thereby reduce a risk of deformations of the reticle.

According to an embodiment of the invention, there is provided a reticle gripper to hold a reticle of a lithographic apparatus, the reticle gripper including an exactly constrained design to determine with respect to the reticle gripper a position of in total 3 points on a surface of the reticle.

In another embodiment of the invention, there is provided a lithographic apparatus including a reticle gripper according to an embodiment of the invention.

According to a further embodiment of the invention, there is provided a reticle handler robot including a reticle gripper according to an embodiment of the invention.

According to a still further embodiment of the invention, there is provided a reticle handler robot including a reticle gripper according to an embodiment of the invention.

According to an again still further embodiment of the invention, there is provided a method to bring a reticle to a reticle support, the reticle support to hold the reticle, the method including: gripping the reticle by a reticle gripper; bringing the reticle by the reticle gripper to the reticle support; reducing to substantially zero a holding force with which the reticle is held by the gripper; applying a holding force by the support, the holding force by the support to be applied after the holding force by the reticle gripper has been reduced to substantially zero.

In an embodiment of the invention, there is provided a lithographic apparatus including an illumination system configured to condition a beam of radiation; a support configured to support a patterning device, the patterning device adapted to pattern the beam of radiation to form a patterned beam of radiation; a substrate support configured to support a substrate; a projection system configured to project the patterned beam of radiation on the substrate, and an apparatus configured to place the patterning device on the support, the apparatus including three gripper structures that are configured to apply three holding forces on a surface of the patterning device, the three holding forces being applied on three different contacting points of the surface, wherein the three different contacting points define a plane.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
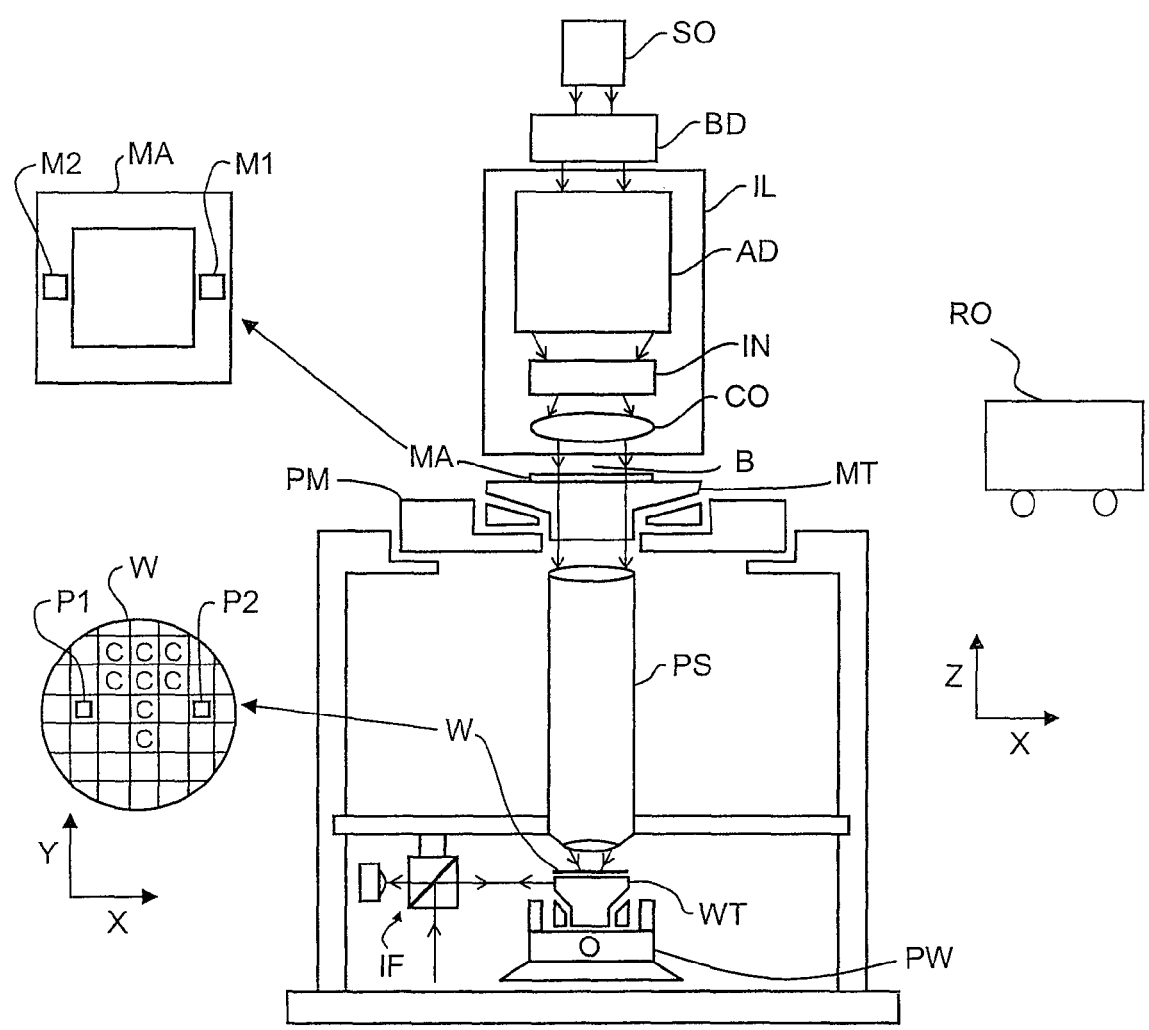
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the mask table MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above-described modes of use or entirely different modes of use may also be employed.

Figure 2:
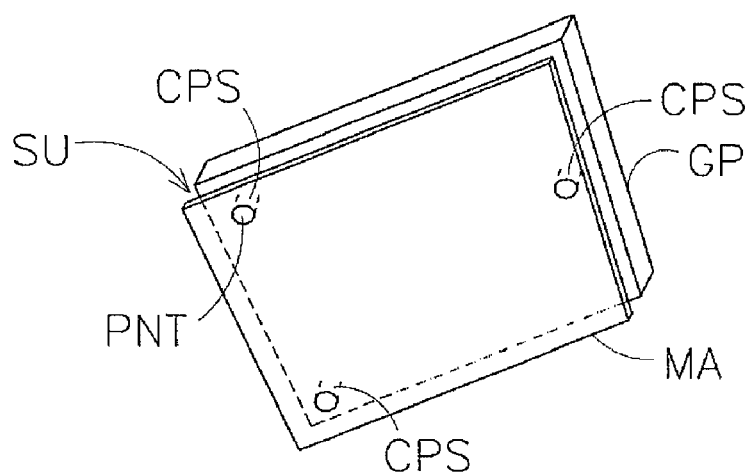
FIG. 2 depicts a highly schematic view of a gripper according to an embodiment of the invention.

FIG. 2 provides a perspective view of a mask, in this example reticle MA held by reticle gripper GP. The reticle gripper GP in this example includes 3 gripper structures, each including a rigid contact point structure CPS, and each to fix with respect to the reticle gripper a position of a point PNT on a surface SU of the reticle MA. A contacting area of contact point structures CPS, at which they contact the surface SU of the reticle MA, is small with respect to the surface area of the reticle. Theoretically, the contacting point structure contacts the surface of the reticle at a single point. In a practical implementation, the contacting point structures, may contain a spherical tip to contact the surface of the reticle, thereby approaching a single point contact. In the ideal case of a contacting point having an infinitely small contacting surface, the reticle gripper fixes the position of 3 points (in total) on the surface of the reticle, i.e. the points PNT. The 3 points on the surface of the reticle, of which the position is fixed with respect to the reticle gripper provide for an exactly constrained holding of the reticle by the gripper. The 3 contacting points, as well as the corresponding contact point structures CPS of the gripper, define a plane intersecting the 3 points. Exactly 3 points are required to pose 3 constraints on the positioning of the reticle.

The example shown here in FIG. 2 is a simple exemplary embodiment to illustrate the principle of an exactly constrained design of the gripper. With the term "exactly constrained design", reference is made to a design which fixes an exactly required number of degrees of freedom of the reticle. As the reticle, or in general any object, is a three-dimensional structure, fixing a position thereof would require a fixing of 6 degrees of freedom, i.e. 3 rotations and 3 translations. To achieve an exactly constrained design however, the gripper is configured to fix just a plane, instead of fixing the complete position of the object (in this case the reticle). Thus, 3 degrees of freedom are fixed with 3 constraints. The other 3 of the in total 6 degrees of freedom (in this case 2 translations in the plane of the reticle and a rotation in the plane of the reticle) are not directly constrained by the gripper: in these other degrees of freedom, once the gripper holds the reticle, friction between the gripper and the reticle keeps the reticle in place in these other degrees of freedom. The exactly constrained design intends to eliminate or at least reduce out of plane deformation, and therefore, the gripper is required to constrain only the 3 degrees of freedom orthogonal to the plane of the reticle. In the example shown here, this is achieved by determining, thus fixing a position of 3 points on the surface of the reticle MA.

By the exactly constrained design, which may in literature also be indicated by the term kinematic design, an over-constrained or under-constrained holding of the reticle is avoided.

By the exactly constrained design of the reticle gripper, a simple example thereof having been described with reference to FIG. 2, forces on the reticle which may result in deformation thereof, may be avoided. Thus, the reticle gripper may hold the reticle without over constraining, thus thereby significantly reducing forces on the reticle, which could lead to a deformation thereof during the holding of the reticle by the gripper.

A force to pull the reticle towards the contact point structures CPS may be provided by any suitable vacuum or under pressure devices, as will be described in more detail below.

The example shown in FIG. 2 is an example of a gripper which includes 3 gripper structures, in this example each of the gripper structures includes the rigid contact point structure CPS, the gripper structures each to fix the position of one of the 3 points on the surface of the reticle MA.

Figure 3:
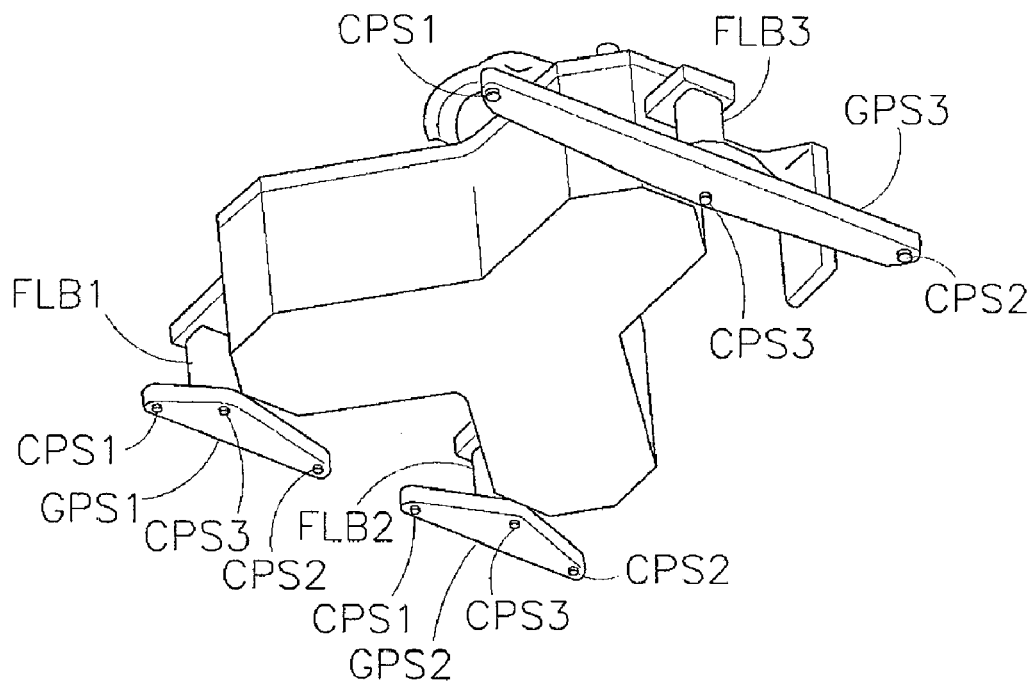
FIG. 3 depicts a perspective view of a gripper according to another embodiment of the invention.

A further embodiment is now described with reference to FIG. 3. FIG. 3 shows a reticle gripper including gripper structures GPS1, GPS2 and GPS3 respectively. Each of these gripper structures includes 3 contact point structures CPS1, CPS2 and CPS3 respectively, to contact a surface of the reticle (not shown in FIG. 3). Each of the gripper structure GPS1, GPS2 and GPS3 is to fix a position of a single point on the surface of the reticle. Thereto, and to avoid an over constrained design, each of the gripper structures GPS1, GPS2 and GPS3 is movable with respect to a plane intersecting the 3 points, by an axially stiff flexure (the axis in a direction substantially perpendicular to the plane intersecting the 3 points), thereby e.g. arriving at a whiffle tree design element. Whiffle tree mounts (such as referred to in U.S. Pat. No. 4,776,684), are sometimes used to support large optical elements in a telescope in a way to avoid unwanted gravity sag induced by self weight of the optical element (a large lens or mirror). Thus, such whiffle tree designs are known from a different field (telescopes in stead of reticle grippers), and are applied to obtain a different effect than the effect that may be sought for in the reticle gripper, because in telescope mounts, such whiffle tree design is used to avoid unwanted gravity sag, while in the gripper described here, a whiffle tree design element may be used to avoid deformation by interaction with the gripper, during the handling, the removal and/or placement of a reticle on a reticle support. The plane intersecting the 3 points may in FIG. 3 be considered an imaginary, not explicitly indicated plane which touches the contact points CPS1, CPS2 and CPS3 respectively of each of the gripper structures GPS1, GPS2 and GPS3, while the points on this plane (thus on the surface of the reticle) in this example will be found at positions between the contact points CPS1, CPS2 and CPS3 respectively of each of the gripper structures GPS1, GPS2 and GPS3. Bearings, such as in this example flexural bearings FLB1, FLB2 and FLB3, are provided to make the corresponding gripper structure GPS1, GPS2 and GPS3 respectively, movable with respect to the plane. In a preferred embodiment, the flexural bearings include axially stiff flexures (thus being compliant in 5 degrees of freedom), in another possible embodiment, tiltable flexural bearings could be applied (thus being compliant in 3 degrees of freedom). In fact, in the case of a tiltable flexural bearing, the gripper structure may be seen as to be tiltable with respect to the point on the surface of the substrate. Whether in a tilted or otherwise displaced state or aligned with the plane intersecting the points, the respective point which each of the gripper structures GPS1, GPS2 and GPS3 respectively, fixes, may be substantially in a plane intersecting the contacting surfaces of each of the contact point structures CPS1, CPS2 and CPS3, of each of the gripper structures GPS1, GPS2 and GPS3. This is because the flexural bearing is axially stiff (in a direction orthogonal to the plane fixed by the 3 points, thus substantially orthogonal to the plane of the reticle). Further, in this embodiment the contacting point structures CPS1, CPS2 and CPS3 are positioned in some way around the point, in the example shown here in a triangular fashion.

Figure 4:
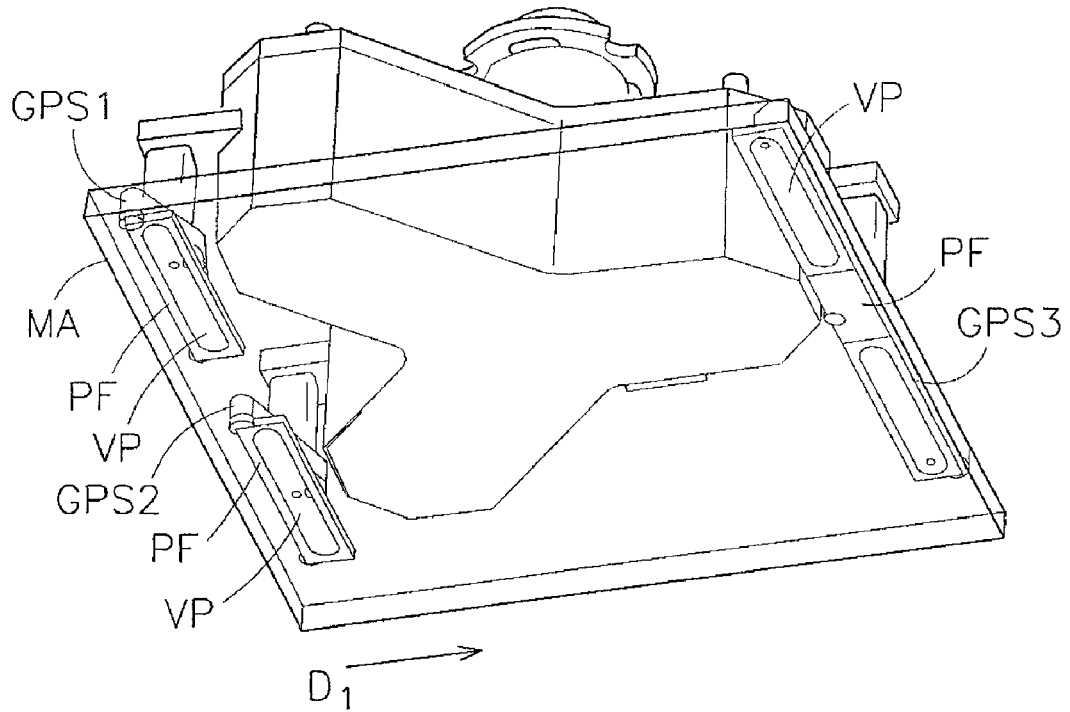
FIG. 4 depicts a perspective view of the gripper according to FIG. 3 and a reticle in a partly transparent view.

FIG. 4 shows the gripper according to FIG. 3, and a reticle MA held by it. Further, FIG. 4 shows vacuum pads, which are preferably made of a flexible material to avoid posing additional constraints onto the reticle, thereby avoiding a risk of a deformation thereof. In FIG. 3, these vacuum pads have not been drawn for clarity purposes. The vacuum pads (being provided with vacuum of underpressure) provide for a pulling of the reticle MA towards the gripper structures GPS1, GPS2 and GPS3. In FIG. 4, the points of the surface of the reticle of which the position is fixed, are indicated by PF. In this embodiment, an area of application of the vacuum pads VP is substantially symmetrical with respect to the point, or at least with respect to a line which crosses the point, to provide a stable contacting and to avoid forces onto the reticle which might result in a deformation thereof. In particular this effect is achieved in the embodiment according to FIG. 4, in that the 3 gripper structures GPS1, GPS2 and GPS3, and consequently the 3 application areas of the vacuum pads VP, are substantially symmetrical with respect to a line parallel to the direction indicated in FIG. 4 by D1. In the embodiment shown here, the vacuum pads also cover the 3 contact point structures of each of the gripper structures. To avoid to thereby provide compliancy in a direction perpendicular to the plane (thus to the surface of the reticle), the vacuum pad may include a thin layer of flexible material covering the contact point structures. A vacuum or underpressure duct may be provided in the gripper structure, ending behind the vacuum pad.

Figure 5:
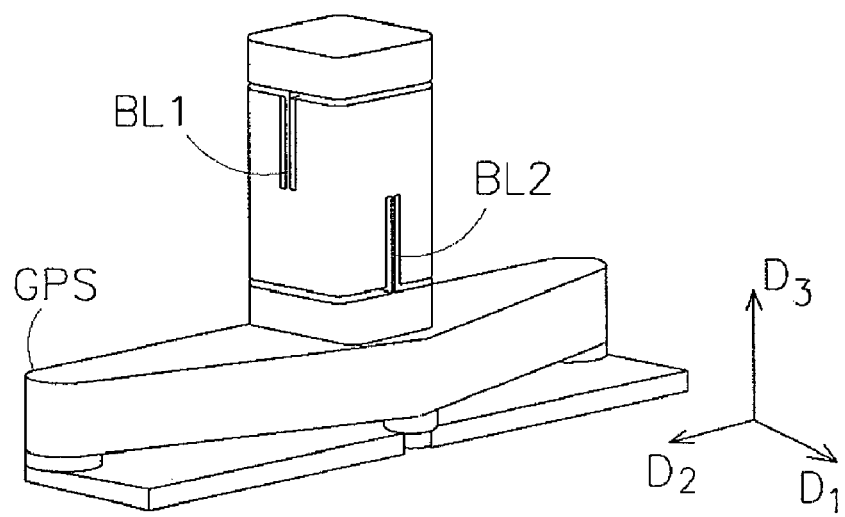
FIG. 5 depicts a detailed view of a part of the gripper according to FIGS. 3 and 4.

FIG. 5 shows an embodiment of a flexural bearing of the embodiment of the gripper according to FIGS. 3 and 4. The flexural bearing includes two blades BL1, BL2 which are orthogonal to one another and offset in the direction substantially perpendicular to the plane (this direction being indicated in FIG. 5 by arrow D3).

The blades BL1, BL2 extend substantially parallel to the direction D3. By the blades of the flexural bearing, a structure is provided which is stiff in the direction D3, while it allows some degree of tilting of the respective gripper structure GPS with respect to the plane defined by D1, D2, thus effectively fixing a position of a single point, the point being coaxial with the line along direction D3 which intersects both the blades BL1 and BL2. This arrangement is compliant in rotation about directions D1, D2 and D3. Further, the arrangement is compliant in translation in the directions D2 and D1. Thus, the flexural bearing is stiff only in one direction, i.e. the direction D3. Therefore, it provides one constraint only. Instead of the flexural bearing shown here, a sliding or rolling bearing may be provided. Further, instead of an arrangement that is compliant in rotation about directions D1, D2 and D3 as well as compliant in translation in the directions D2 and D1, an arrangement could be applied that is compliant in rotation about directions D1, D2 and D3, while not providing the translation compliances about D2 and D1. Thereby, in a strict sense, no kinematic design is provided, however, as will be easily understood by the skilled person, these properties are of somewhat secondary importance: if the translational compliancy is left away, freedom in these directions is provided by a translation of the point of application of the gripper structure on the surface of the reticle, thereby still arriving at 3 constraints, thus at an exactly constrained design.

Thus, in the embodiment shown in and described with reference to FIGS. 3-5, or similar embodiments, the gripper structure which includes 3 contact points, the gripper structure includes a bearing to be at least rotationally movable with respect to the plane intersecting the 3 points, while the bearing is stiff in a direction substantially perpendicular to the plane. A simple, compact, and thereby lightweight example of such bearing is the axially stiff flexural bearing shown in FIG. 5. The bearing shown in FIG. 5 may be applied for the flexural bearing FLB1, FLB2 and/or FLB3, to provide the axially stiff flexure of the gripper structures GPS1, GPS2 and GPS3 respectively. Along the direction substantially perpendicular to the plane, the flexural bearing shown here is coaxial with the respective point on the surface of the reticle.

With the gripper as described with reference to FIGS. 3, 4 and 5, a design is provided which is capable of contacting the surface of the reticle only at ends thereof (see FIG. 4), fixing with respect to the gripper exactly 3 points on the surface of the reticle, thereby providing an exactly constrained design. A size of the third gripper structure GPS3 has in this example been chosen larger than those of the first and second gripper structures as in this embodiment the third gripper structure GPS3 is a single gripper structure which holds one end of the surface of the reticle while the two other gripper structures GPS1 and GPS2 together hold another end of the surface of the reticle.

Thereby, it can be provided that the vacuum pad VP of the third gripper structure GPS3 has a larger size than that of the first and second gripper structures, to enable the third gripper structure GPS3 on its own to carry a same or similar weight as the first and second gripper structures GPS1 and GPS2 together.

Figure 6A:
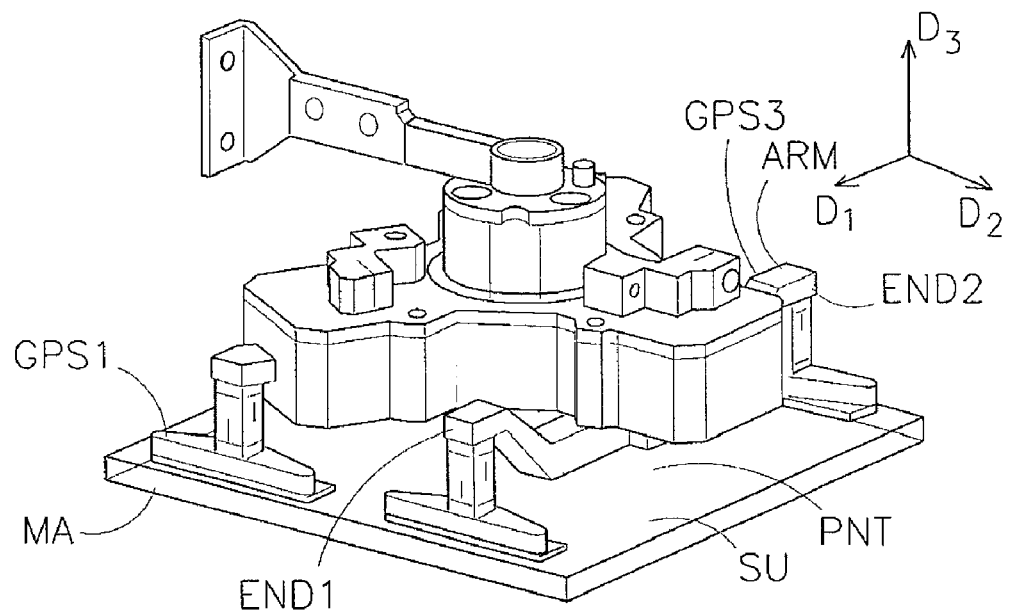
FIGS. 6a and b depict a perspective view of a further embodiment of a gripper according to the invention.
Figure 6B:
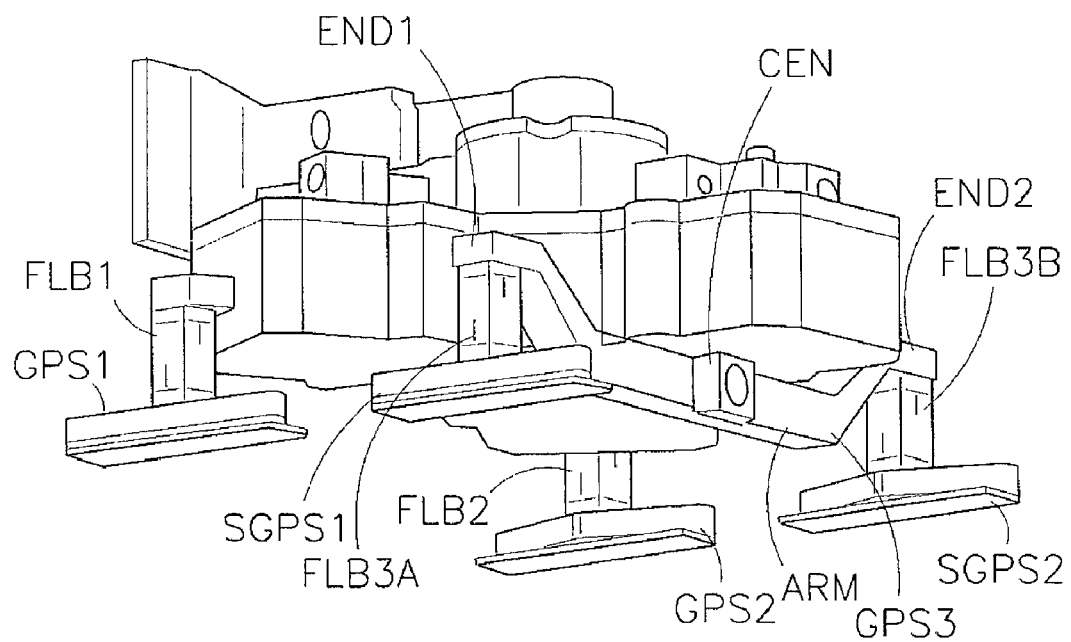

FIGS. 6a and 6b show a gripper according to an embodiment of the invention. In this embodiment, as depicted in FIG. 6a, the first and second gripper structure GPS1, GPS2 may be similar to those of the embodiment shown in FIGS. 3, 4 and 5. It is however noted that in this embodiment, the gripper structures GPS1, GPS2 are, instead of being positioned to hold a same end of the surface of the reticle, positioned to hold opposite ends thereof as shown in FIGS. 6a and 6b. In the embodiment shown in FIGS. 6a and 6b, the third gripper structure GPS3 includes an arm ARM having two ends END1, END2. The arm is pivotable by a pivot (an example of which will be described in more detail below) about a center CEN of the arm to allow a rotation about a pivot axis, which extends substantially parallel to the direction D2, thus substantially perpendicular to the arm ARM. By the pivotability, the arm ARM is allowed some degrees of rotation with respect to a plane defined by D1, D2, thus a plane which is substantially parallel to the surface SU of the reticle MA. The ends END1, END2 of the arm ARM are each provided with a flexural bearing which may be of a similar construction to the one depicted in and described with reference to FIG. 5. The flexural bearings (or other bearings), indicated in FIGS. 6a and 6b as FLB3A, FLB3B each connect a respective sub gripper structure SGPS1, SGPS2 which may be of a design and construction similar to gripper structures GPS1, GPS2. Thus, these flexural bearings provide for an axially stiff flexural bearing, being axially stiff in a direction substantially perpendicular to the surface of the reticle, thus to the plane intersecting the 3 points, in a equilibrium position of the arm, thus in a position in which the arm is when gripping a reticle having a perfectly flat surface. The third gripper structure GPS3 including the arm ARM, fixes a position of a single point on the surface of the reticle, with respect to the gripper, an approximate position of this point being indicated by PNT, i.e. between the sub gripper structures SGPS1 and SGPS2, and largely determined by the pivot axis of the arm ARM.

Alternatively to the design shown here, it is also possible that the gripper structures GPS1 and GPS2 are positioned to grip a same end of the surface of the reticle (similarly to the embodiments shown in FIGS. 3 and 4), while the sub gripper structures SGPS1 and SGPS2 are positioned to act on an opposite end of the surface of the reticle. It will be appreciated by the skilled person that such a configuration may be obtained by modification of the embodiment shown in FIGS. 6A and 6B.

The embodiment as depicted in and described with reference to FIGS. 6A and 6B, poses only 3 axial constraints on the surface of the reticle, similar to the embodiments depicted in and described with reference to FIG. 2 as well as FIGS. 3-5 respectively. This is because gripper structures GPS1 and GPS2 are at least rotatable with respect to the surface SU of the reticle MA by the flexural bearings FLB1, FLB2, (preferable, the bearings are compliant in 5 degrees of freedom, thereby providing a single axial constraint only as has been described above with reference to FIGS. 3-5) while the arm ARM of gripper structure GPS3 is pivotable about a pivot to some extent.

Figure 7:
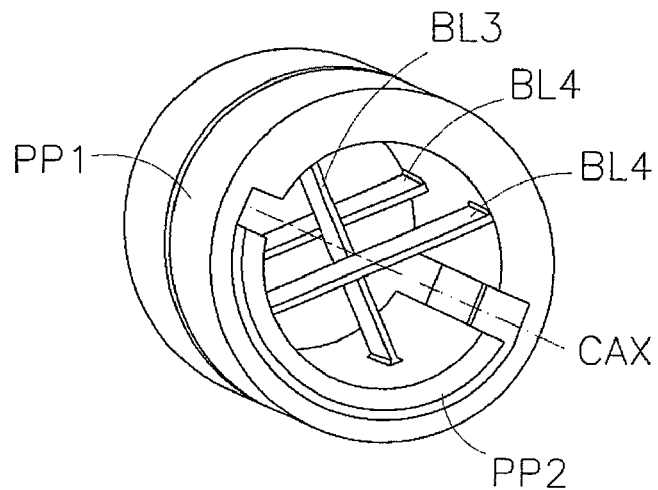
FIG. 7 depicts a bearing for the gripper according to FIGS. 6a and 6b.

FIG. 7 shows an example of a pivot that may be used to make the arm ARM of gripper structure GPS3, pivotable. The pivot shown here (an example of which having been described in U.S. Pat. No. 3,319,951) includes a rotatable flexural bearing which is provided with at least one blade BL3 and at least one blade BL4 (in this example two blades BL4 being shown) the blades being substantially orthogonal to one another, the blades connecting a first part of the pivot PP1 to a second part of the pivot PP2. By a flexing of the blades BL3, BL4 some rotation of the second part PP2 with respect to the first part PP1 may be provided, the rotation being with respect to a center axis CAX, the blades BL3, BL4 in this embodiment "crossing" each other, seen in a direction along the center axis CAX, substantially coaxial with the axis CAX. Other types of pivot bearings could be used, such as flexural, rolling, sliding bearings etc.

The reticle gripper according to an embodiment of the invention can be applied e.g. in a lithographic apparatus, or in a reticle handler robot. For example, FIG. 1 shows a reticle handler robot RO according to an embodiment of the invention.

Figure 8:
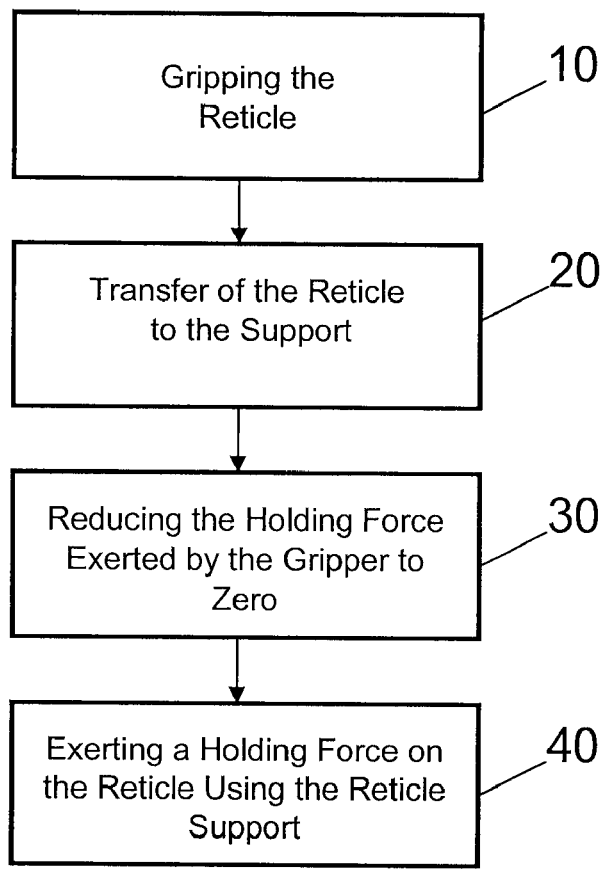
FIG. 8 depicts a flow diagram of a method according to a further aspect of the invention.

A further embodiment of the invention is described with reference to FIG. 8. FIG. 8 shows a flow diagram of a method according to an embodiment of the invention. The method describes a transfer of a reticle to a reticle support, such as the mask table MT depicted in and described with reference to FIG. 1. In step 10, the reticle is gripped by a reticle gripper, which may be (but not necessarily needs to be) an exactly constrained reticle gripper as described above. Then, as indicated in 20, the reticle is brought/transferred by the reticle gripper to the support. In an embodiment, the reticle is held by the reticle gripper against the support. Then, as described in 30, a holding force with which the reticle is held by the gripper, is reduced to substantially zero. After the holding force by the reticle gripper has been reduced to substantially zero, a holding force is applied by the support, as indicated by 40. This method can be applied with any reticle gripper, and may reduce a deformation of the reticle by the reticle gripper, because only after the gripping force by the gripper is reduced to substantial zero, the holding force by the reticle support is applied. If this method is applied in combination with the exact constrained design of the gripper as described above, a risk of deformation of the reticle is reduced even further.

In general, when in this document the term movable, pivotable, tiltable etc is applied in a context of the gripper and its constructive elements, this does not necessarily imply large ranges of movement. Instead, it is equally well possible that a movability, pivotability, tiltability, etc. is provided over a small range of movement, i.e. a small angle of rotation (e.g. in an order of magnitude of degrees, minutes, seconds, tens of milliradians, milliradians, tenths of milliradians, or smaller), a small range of translation, etc, such ranges being chosen to be sufficient to follow an unflatness of the surface of the reticle. The range of movement may be chosen by the skilled person in dependency on a maximum unflatness of the surface of the reticle and/or mechanical tolerances of the gripper itself.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A reticle gripper configured to hold a reticle of a lithographic apparatus, the reticle gripper comprising an exactly constrained design to determine a position of a total of three points on a surface of the reticle with respect to the reticle gripper, the exactly constrained design of the reticle gripper being defined by three gripper structures to contact the surface of the reticle, each of the three gripper structures configured to determine a position of one of the three points with respect to the reticle gripper,
wherein at least one of the gripper structures comprises an elongated arm and three non-aligned contact point structures that each protrude from a different location on the elongated arm to contact and support the surface of the reticle around one of the three points at three different positions that form the summits of a triangle.

2. The reticle gripper of claim 1, wherein at least one of the gripper structures comprises a rigid point structure.

3. The reticle gripper of claim 1, wherein the at least one of the gripper structures comprises a bearing and wherein the bearing is at least rotationally movable with respect to a plane intersecting the three points, the bearing being stiff in a direction substantially perpendicular to the plane intersecting the three points.

4. The reticle gripper of claim 3, wherein the bearing comprises an axially stiff flexural bearing.

5. The reticle gripper of claim 4, wherein the flexural bearing is substantially coaxial with the respective point on the surface of the reticle along a direction substantially perpendicular to the plane.

6. The reticle gripper of claim 5, wherein the flexural bearing comprises two blades which are substantially orthogonal to each other and offset in the direction substantially perpendicular to the plane, the blades extending substantially parallel to the direction.

7. The reticle gripper of claim 3, wherein the bearing comprises a sliding or rolling bearing.

8. The reticle gripper of claim 3, wherein the gripper structure comprises a flexible vacuum pad configured to pull the reticle towards the gripper.

9. The reticle gripper of claim 1, wherein the arm includes two ends and a pivot, the pivot configured to make the arm pivotable about a center thereof to allow a tilting of the arm with respect to a plane.

10. The reticle gripper of claim 9, wherein the ends of the arm are each provided with a bearing to connect respective sub gripper structures, each comprising three contact point structures, to the ends of the arm.

11. The reticle gripper of claim 10, wherein the bearing to connect the respective sub gripper structures comprises an axially stiff bearing which is stiff in a direction substantially perpendicular to the plane intersecting the three points, in an equilibrium position of the arm.

12. The reticle gripper of claim 10, wherein the sub gripper structures each comprise a flexible vacuum pad to pull the reticle towards the gripper.

13. The reticle gripper of claim 9, wherein the pivot comprises a rotational flexural bearing.

14. A lithographic apparatus comprising a reticle gripper according to claim 1.

15. The lithographic apparatus of claim 14, comprising:
a support configured to support a patterning device, the patterning device adapted to pattern a beam of radiation to form a patterned beam of radiation;
a substrate support configured to support a substrate; and
a projection system configured to project the patterned beam of radiation on the substrate.

16. A reticle handler robot comprising a reticle gripper according to claim 1.

17. A device manufacturing method comprising
gripping a reticle by a reticle gripper according to claim 1;
positioning the reticle by the gripper on a support structure;
irradiating a pattern onto a substrate via the reticle held by the support structure;

developing the irradiated substrate; and manufacturing a device from the developed substrate.

18. The reticle gripper of claim 1, configured to transfer the reticle to a reticle stage of the lithographic apparatus.

19. A method to bring a reticle to a reticle support, the reticle support to hold the reticle, the method comprising:
- gripping the reticle by a reticle gripper;
- bringing the reticle by the reticle gripper to the reticle support;
- reducing a holding force with which the reticle is held by the gripper to substantially zero; and
- applying a holding force by the support, the holding force by the support to be applied after the holding force by the reticle gripper has been reduced to substantially zero wherein the reticle gripper includes three gripper structures to contact the surface of the reticle, and
- wherein at least one of the gripper structures comprises an elongated arm and three non-aligned contact point structures that each protrude from a different location on the elongated arm to contact and support the surface of the reticle around one of the three points at three different positions that form the summits of a triangle.

20. An apparatus configured to hold a patterning device for use in a lithographic apparatus, the apparatus comprising three gripper structures that are configured to apply three holding forces on a surface of the patterning device, the three holding forces being applied on three different contacting points of the surface, wherein the three different contacting points define a plane,
- wherein at least one of the gripper structures comprises an elongated arm and three non-aligned contact point structures that each protrude from a different location on the elongated arm to contact and support the surface of the reticle around one of the three points at three different positions that form the summits of a triangle.

21. The apparatus of claim 20, wherein each of the three gripper structures is configured to contact the surface at three different points.

* * * * *